(12) United States Patent
Müller et al.

(10) Patent No.: US 7,375,656 B2
(45) Date of Patent: May 20, 2008

(54) CIRCUIT CONFIGURATION FOR A CAPACITIVE TOUCH SWITCH

(75) Inventors: Roland Müller, Opfenbach (DE); Harald Mangold, Lippach (DE); Werner Kaps, Weiler-Simmerberg (DE)

(73) Assignee: Diehl AKO Stiftung & Co. KG, Wangen/BRD (DE)

( * ) Notice: Subject to any disclaimer, the term of this patent is extended or adjusted under 35 U.S.C. 154(b) by 201 days.

(21) Appl. No.: 11/311,776

(22) Filed: Dec. 19, 2005

(65) Prior Publication Data

US 2006/0145539 A1    Jul. 6, 2006

(30) Foreign Application Priority Data

Dec. 17, 2004 (DE) .............. 10 2004 060 847
Apr. 1, 2005  (DE) .............. 10 2005 014 933

(51) Int. Cl.
*G06F 13/00* (2006.01)

(52) U.S. Cl. .................. 341/33; 341/22; 178/18.02

(58) Field of Classification Search ........... 341/22, 341/33; 178/18.02, 18.06; 307/99, 109
See application file for complete search history.

(56) References Cited

U.S. PATENT DOCUMENTS

| | | | |
|---|---|---|---|
| 4,550,310 A | | 10/1985 | Yamaguchi et al. |
| 5,498,914 A | | 3/1996 | De Boer |
| 5,801,340 A | * | 9/1998 | Peter .............. 178/20.04 |
| 6,774,789 B2 | | 8/2004 | Inaba et al. |

FOREIGN PATENT DOCUMENTS

| | | |
|---|---|---|
| CH | 631 582 A5 | 8/1982 |
| DE | 32 45 803 | 6/1984 |
| DE | 298 22 566 U1 | 5/2000 |
| DE | 100 61 351 A1 | 6/2002 |
| DE | 103 03 480 | 8/2004 |
| EP | 0 632 593 A1 | 1/1995 |
| EP | 0 859 468 | 8/1998 |
| JP | 2002-57564 A | 2/2002 |
| JP | 2002039708 A | 2/2002 |

\* cited by examiner

*Primary Examiner*—Brian Zimmerman
*Assistant Examiner*—Hung Q Dang
(74) *Attorney, Agent, or Firm*—Laurence A. Greenberg; Werner H. Stemer; Ralph E. Locher

(57) ABSTRACT

A circuit configuration for a capacitive touch switch contains at least one sensor circuit with a capacitive sensor element which changes its capacitance value when touched, and an evaluation circuit which is supplied with an output signal from the sensor circuit in order to determine whether the capacitive sensor element is actuated or not. The at least one sensor circuit has a capacitance which is connected in parallel with the capacitive sensor element, and a capacitance/frequency converter which is connected to the parallel circuit containing the capacitance and the capacitive sensor element and generates, at its output, a frequency signal whose frequency depends on the total capacitance of the parallel circuit containing the capacitance and the capacitive sensor element. The evaluation circuit may thus use a significant change in the frequency of the output signal from the sensor circuit to deduce, in a simple manner, that the capacitive sensor element has been touched.

12 Claims, 4 Drawing Sheets

CIRCUIT CONFIGURATION FOR A CAPACITIVE TOUCH SWITCH

BACKGROUND OF THE INVENTION

Field of the Invention

The present invention relates to a circuit configuration for a capacitive touch switch. The circuit configuration has at least one sensor circuit with a capacitive sensor element which changes its capacitance value when touched; and an evaluation circuit which is supplied with an output signal from the sensor circuit in order to determine whether the capacitive sensor element is actuated or not.

Touch switches which initiate a particular switching operation when simply touched by a user are being used more and more often in many electrical appliances, in particular also in domestic appliances such as stoves, hobs, microwave ovens, dishwashers, washing machines and the like. In the case of a capacitive touch sensor or switch, the sensor circuit has, for example, a capacitor surface element which, together with the user, forms a capacitance which is variable in accordance with actuation of the capacitive sensor element, that is to say in accordance with whether the capacitor surface element is touched or not. The change in the capacitance of the capacitive sensor element as a result of it being touched by the user has a corresponding effect on an output signal from the sensor circuit, which is accordingly evaluated by a connected evaluation circuit for determining whether the capacitive touch switch has been activated (touched).

Such a circuit configuration for a capacitive touch switch is disclosed, for example, in published, non-prosecuted German patent applications DE 32 45 803 A1 and DE 103 03 480 A1 or Europran patent EP 0 859 468 B1.

SUMMARY OF THE INVENTION

It is accordingly an object of the invention to provide a circuit configuration for a capacitive touch switch that overcomes the above-mentioned disadvantages of the prior art devices of this general type, which circuit configuration makes it possible for the output signal from the sensor circuit to be evaluated in a simple manner.

With the foregoing and other objects in view there is provided, in accordance with the invention, a circuit configuration for a capacitive touch switch. The circuit configuration contains at least one sensor circuit. The at least one sensor circuit contains a capacitive sensor element changing its capacitance value when touched, a capacitor connected in parallel with the capacitive sensor element and defining a parallel circuit, and a capacitance/frequency converter connected to the parallel circuit containing the capacitor and the capacitive sensor element. The capacitance/frequency converter generates and outputs a frequency signal having a frequency being dependent on a total capacitance of the parallel circuit formed of the capacitor and the capacitive sensor element. An evaluation circuit is provided and receives the frequency signal, being an output signal from the sensor circuit, for determining whether the capacitive sensor element is actuated or not.

The circuit configuration for a capacitive touch switch contains at least one sensor circuit with a capacitive sensor element which changes its capacitance value when touched, and an evaluation circuit which is supplied with an output signal from the sensor circuit in order to determine whether the capacitive sensor element is actuated or not. According to the invention, the at least one sensor circuit has a capacitor which is connected in parallel with the capacitive sensor element, and a capacitance/frequency converter which is connected to the parallel circuit containing the capacitor and the capacitive sensor element and generates, at its output, a frequency signal whose frequency depends on the total capacitance of the parallel circuit containing the capacitor and the capacitive sensor element.

The total capacitance at an input of the capacitance/frequency converter is determined, on the one hand, by the fixed capacitor and, on the other hand, by the capacitance value of the capacitive sensor element, the capacitance value being changed as a result of the sensor element being touched. The change in the capacitance value of the capacitive sensor element when the latter is touched leads to a corresponding change in the total capacitance of the sensor circuit, which, in turn, leads to a change in the frequency of the output signal from the capacitance/frequency converter. In order to determine whether the capacitive touch switch is actuated, the evaluation circuit must evaluate only a change in the frequency of the output signal from the capacitance/frequency converter, which is possible using simple measures.

The input of the capacitance/frequency converter is preferably connected in parallel with the parallel circuit containing the capacitor and the capacitive sensor element.

In a first preferred embodiment of the invention, the capacitance/frequency converter is formed from an inverter having input hysteresis, the output of which inverter is fed back to its input via a resistor. The fixed capacitor and the capacitance of the sensor element thus forms a square-wave oscillator whose oscillation frequency depends on the total capacitance of the circuit configuration.

In a second preferred embodiment of the invention, the capacitance/frequency converter is formed from a negating AND gate (NAND) having input hysteresis. The second input of the negating AND gate thus makes it possible to switch off the square-wave oscillator, which has been formed in this manner and whose oscillation frequency depends on the total capacitance of the circuit configuration, or to put it into a static state.

In one refinement of the invention, the circuit configuration may also contain a plurality of sensor circuits each having a capacitive sensor element, the sensor circuits being connected to a common evaluation circuit. In this case, the output signals from the plurality of sensor circuits are alternately supplied to the evaluation circuit via a switch, for example.

In the case of a plurality of sensor circuits, the plurality of sensor circuits may each have an inverter having input hysteresis in a first refinement of the invention, the output signal from which inverter is supplied to the switch. In an alternative refinement, the parallel circuits containing the capacitor and the capacitive sensor element of the plurality of sensor circuits are each directly connected to the switch, and the output of the switch is connected to a common inverter having input hysteresis, with the result that the number of electronic components can be advantageously reduced.

In the case of a plurality of sensor circuits, the plurality of sensor circuits may each have a negating AND gate having input hysteresis in a second refinement of the invention, the output signal from which AND gate is supplied to the switch. In an alternative refinement, the parallel circuits containing the capacitor and the capacitive sensor element of the plurality of sensor circuits are each directly connected to the switch, and the output of the switch is connected to a common negating AND gate having input hysteresis, with the result that the number of electronic components can be advantageously reduced.

The evaluation circuit also contains, for example, an event counter for counting the pulses in the output signal from the one or more sensor circuit(s).

In addition, it is advantageous if the evaluation circuit compares the frequency of the output signal from the one or more sensor circuit(s) with a basic frequency, the basic frequency being a frequency which is averaged over a long period of time of the output signal from the respective sensor circuit when the respective capacitive sensor element is not being touched, in order to compensate for any drift in the switching thresholds and in the component values of the circuit configuration.

Other features which are considered as characteristic for the invention are set forth in the appended claims.

Although the invention is illustrated and described herein as embodied in a circuit configuration for a capacitive touch switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
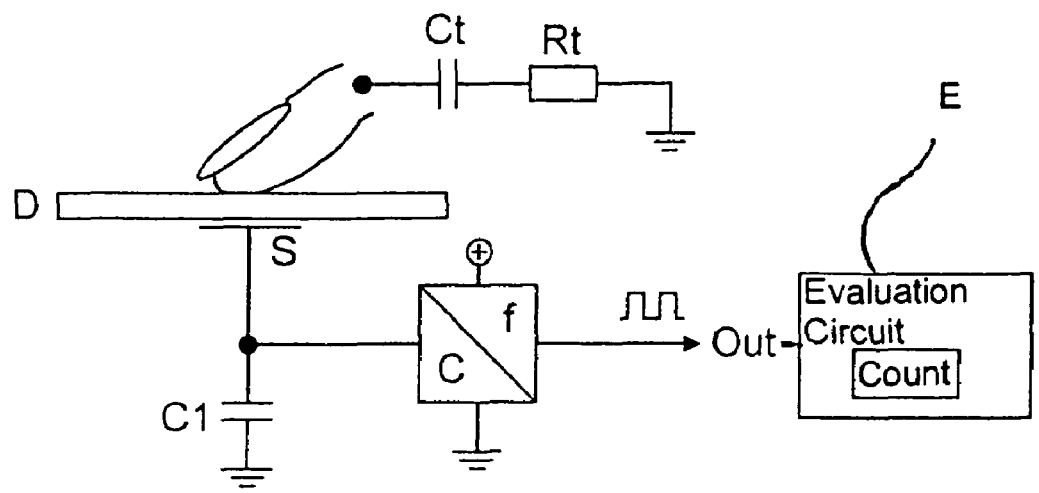
FIG. 1 is a block diagram for explaining the basic principle of a circuit configuration in according to the invention.

Referring now to the figures of the drawing in detail and first, particularly, to FIG. 1 thereof, there is shown a basic configuration of a circuit configuration for a capacitive touch switch which can be used in electrical appliances, in particular in electrical domestic appliances such as stoves, hobs, microwave ovens, dishwashers, washing machines and the like. The basic principle of the present invention is to be explained with reference to FIG. 1; various exemplary embodiments of a circuit configuration according to the invention will then be described with reference to FIGS. 2 to 6.

The circuit configuration for a capacitive touch switch contains a sensor circuit and an evaluation circuit E, the figures each illustrating only the sensor circuit whose output signal is supplied to an evaluation circuit. The sensor circuit contains, in particular, a capacitive sensor element S, for example in the form of a capacitor surface element, which, together with a user, forms a capacitance Ct via a dielectric D as part of a control panel of the domestic appliance. The capacitance Ct of the sensor element S is variable in accordance with actuation of the capacitive touch switch, that is to say in accordance with whether the capacitive sensor element S is touched or not. However, it shall be expressly pointed out at this juncture that the present invention is not restricted to a special type or configuration of the capacitive sensor element S.

A capacitor C1 is connected in parallel with the capacitive sensor element S. An input of a capacitance/frequency converter Cf is connected in parallel with the parallel circuit (formed in this manner) containing the capacitor C1 and the capacitive sensor element S. The capacitance/frequency converter Cf generates, at an output, a square-wave frequency signal Out whose frequency depends on the capacitance at the input of the capacitance/frequency converter Cf.

If the capacitive touch switch is not actuated, that is to say the capacitive sensor element S is not touched, the sensor element does not have the capacitance Ct (Ct=0) and the total capacitance at the input of the capacitance/frequency converter Cf is formed solely by the capacitor C1. In this case, the output signal Out from the capacitance/frequency converter has a particular basic frequency. If, in contrast, the capacitive touch switch is actuated, that is to say the capacitive sensor element S is touched, the total capacitance at the input of the capacitance/frequency converter Cf is formed by the parallel circuit containing the capacitor C1 and the capacitance value Ct of the capacitive sensor element S. This changes the frequency of the output signal Out due to the capacitance/frequency converter Cf.

The evaluation circuit E which is supplied with the output signal Out from the capacitance/frequency converter Cf can detect when the capacitive sensor element S is touched by measuring the frequency by counting the pulses in the output signal Out from the sensor circuit described above. The pulses are counted, for example, using an event counter Count that is integrated in a microcontroller.

In order to compensate for drift (which occurs in practice) in the switching thresholds and in the component values of the sensor circuit, the basic frequency used by the evaluation circuit is preferably the frequency—averaged over a relatively long period of time—when the capacitive sensor element S is not being touched. Actuation of the capacitive touch switch can therefore be simply detected by a sudden change in the frequency of the output signal Out relative to the basic frequency. The sensitivity of the capacitive touch switch can be set using the magnitude of the threshold value for the change in frequency relative to the basic frequency.

Figure 2:
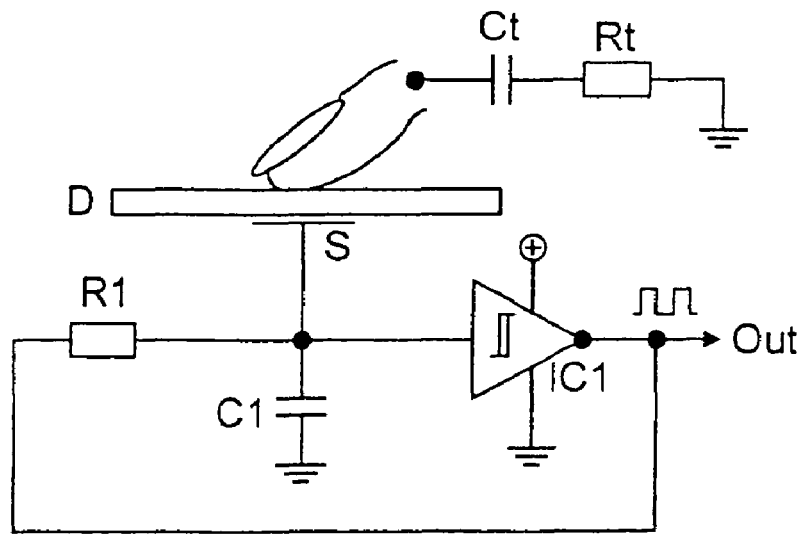
FIG. 2 is a block diagram of the circuit configuration for a capacitive touch switch in accordance with a first exemplary embodiment of the invention.

A first exemplary embodiment of a circuit configuration of the invention will now be described in more detail with reference to FIG. 2.

The capacitance/frequency converter Cf of the basic circuit configuration of FIG. 1 is formed by an inverter IC1 which is fed back via a resistor and has input hysteresis. With the inclusion of the capacitor C1, this configuration forms a square-wave oscillator. In addition to the magnitudes of the input switch-on and switch-off thresholds, the resistance R1, the capacitor C1 and the capacitance value Ct introduced via the capacitive sensor element S are decisive for the frequency of the output signal Out from the square-wave oscillator which has been formed in this manner.

Figure 3:
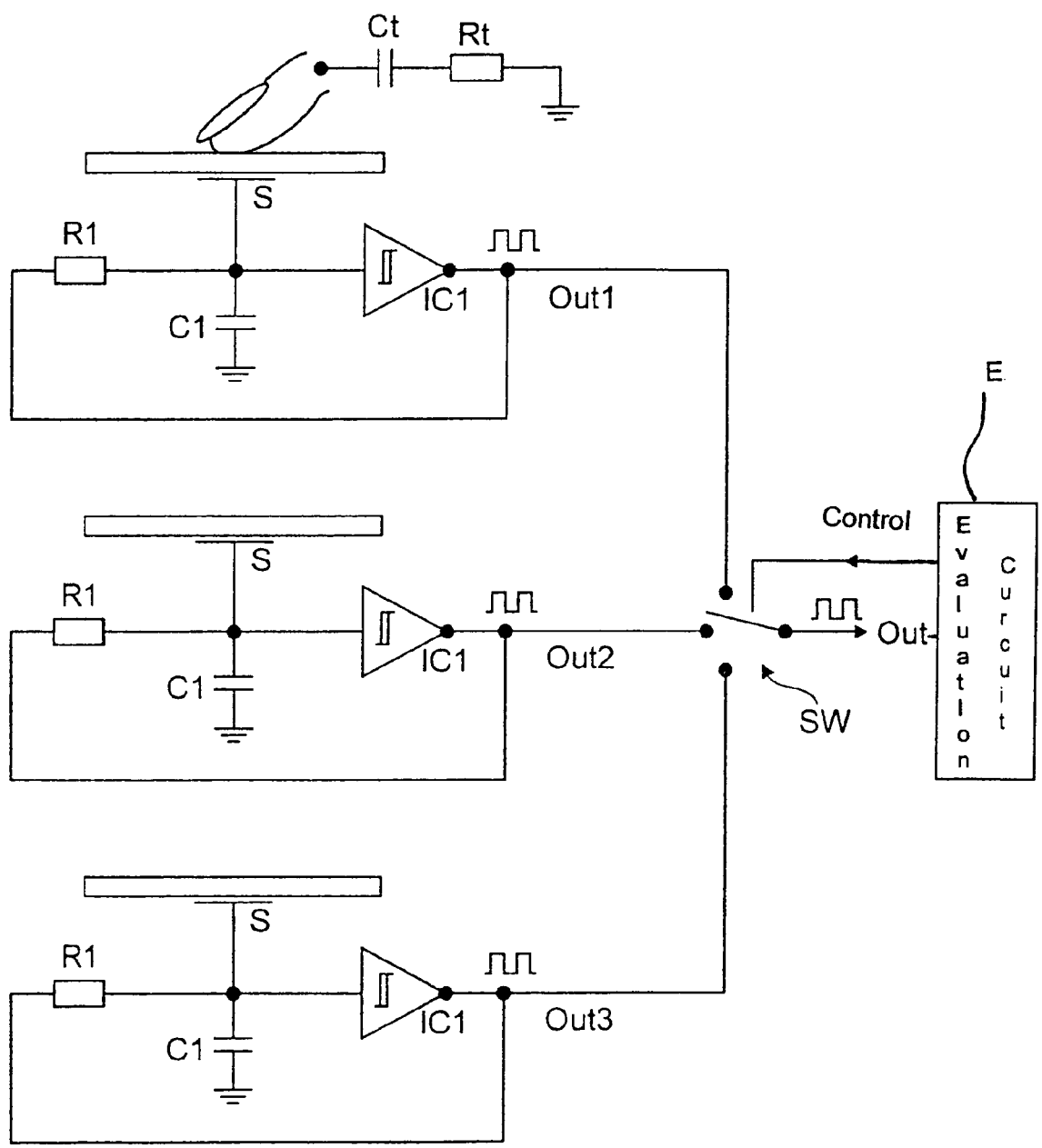
FIG. 3 is a block diagram of the circuit configuration for a plurality of capacitive touch switches in accordance with a second exemplary embodiment of the invention.

As illustrated in the second exemplary embodiment of FIG. 3, the circuit configuration according to the invention for a capacitive touch switch may also have a plurality of sensor circuits whose output signals Out1, Out2, Out3 are supplied to the common evaluation circuit E.

The configuration and method of operation of the individual sensor circuits correspond to those of the sensor circuit explained above with reference to FIG. 2; in particular, each of the sensor circuits contains a capacitive sensor element S, a capacitor C1 and the capacitance/frequency converter Cf. The output signals Out1, Out2, Out3 from the (in this case three) sensor circuits are supplied to the (in this case three) inputs of a changeover switch SW. Under the control of the evaluation circuit, the changeover switch switches its inputs in temporal succession to its one output, with the result that the individual output signals Out1, Out2, Out3 are supplied in temporal succession to the output circuit for further evaluation.

The changeover switch SW may, for example, be formed by a digital multiplexer module which uses time-division multiplexing to apply the output signals Out1, Out2, Out3 from the plurality of sensor circuits to the output. Only one multiplexer module, a sextuple inverter module having input hysteresis and six capacitors and resistors, is needed to evaluate six capacitive sensor elements S, for example.

It goes without saying that the circuit configuration illustrated in FIG. 3 is not restricted to the three sensor circuits having a total of three capacitive sensor elements S. Instead, the output signals Out from only two or from more than three sensor circuits may also be supplied to the common evaluation circuit via the changeover switch SW.

Figure 4:
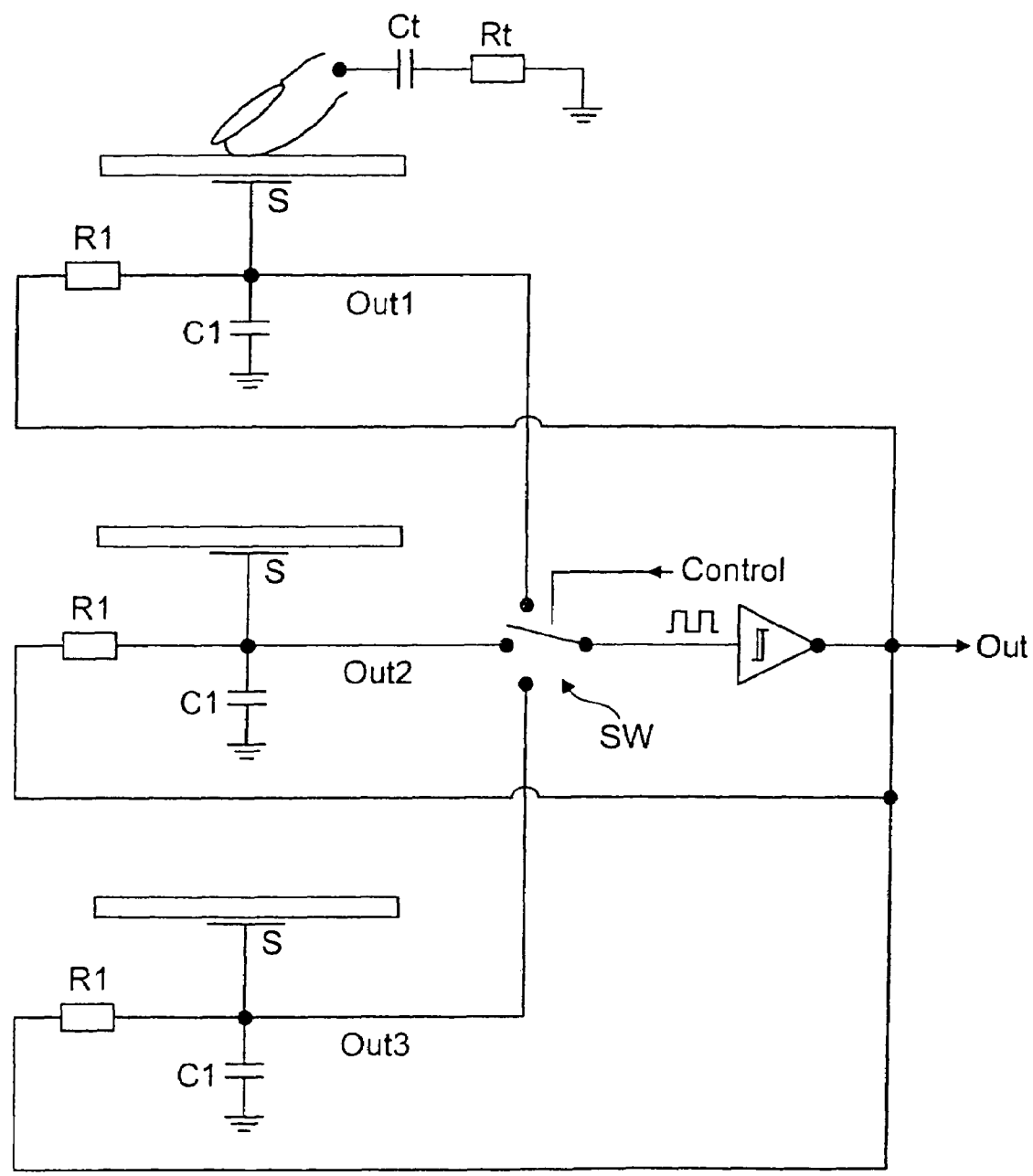
FIG. 4 is a block diagram of the circuit configuration for a plurality of capacitive touch switches in accordance with a third exemplary embodiment of the invention.

FIG. 4 shows, as a third exemplary embodiment of the invention, a variant of the second exemplary embodiment of a circuit configuration having a plurality of sensor circuits.

The circuit configuration of FIG. 4 differs by virtue of the fact that here the parallel circuits containing the capacitor C1 and the capacitance value Ct of the capacitive sensor element S of the plurality of sensor circuits are directly connected to the inputs of the changeover switch SW. In this case, the one output of the changeover switch SW is connected to the evaluation circuit via the inverter IC1. The output of the common inverter IC1 is respectively fed back to the individual sensor circuits via the resistor R1.

In the case of a plurality of sensor circuits, the circuit configuration makes it possible to further reduce the components required since only one individual inverter IC1 has to be used for all of the sensor circuits.

A fourth and a fifth exemplary embodiment of the present invention will be explained below with reference to FIGS. 5 and 6.

The fourth and fifth exemplary embodiments differ from the first and second exemplary embodiments (described above) by virtue of the fact that, instead of an inverter having input hysteresis IC1, the capacitance/frequency converter Cf of the sensor circuit(s) has a negating AND gate (NAND) having input hysteresis IC2. Further components of the circuit configurations and their methods of operation are the same as those described above, with the result that they will not be explained again in detail.

Figure 5:
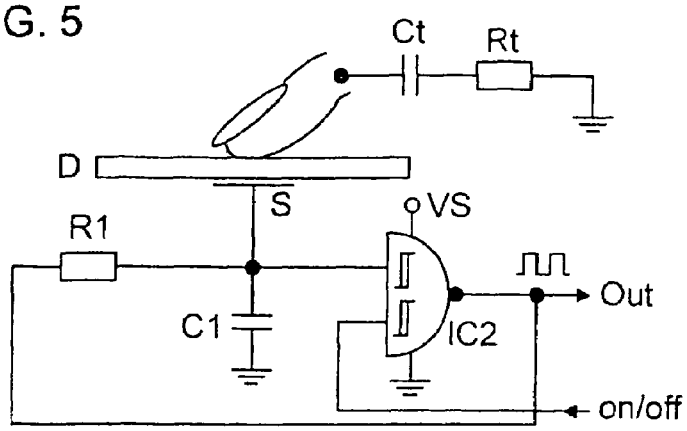
FIG. 5 is a block diagram of the circuit configuration for a capacitive touch switch in accordance with a fourth exemplary embodiment of the invention.

As illustrated in FIG. 5, one input (which has input hysteresis) of the negating AND gate IC2 is connected in parallel with the parallel circuit containing the fixed capacitor C1 and the capacitive sensor element S. The other input (which does not require any input hysteresis) of the negating AND gate IC2 therefore makes it possible to switch off the square-wave oscillator (which is formed by the negating AND gate) as required or to put it into a static state.

This operation of switching off the square-wave oscillator as required has the advantage, particularly when there are a plurality of sensor circuits which are operated using time-division multiplexing, that it is possible to respectively put only that square-wave oscillator which is to be currently evaluated into a state of oscillation; all of the other square-wave oscillators may be switched off. This makes it possible, particularly in the case of sensor lines (connecting lines between the sensor elements S and the inputs of the capacitance/frequency converters Cf) which are close together, to avoid signal overcoupling which would otherwise be easily possible on account of the high sensitivity of the inputs of the capacitance/frequency converters Cf.

Figure 6:
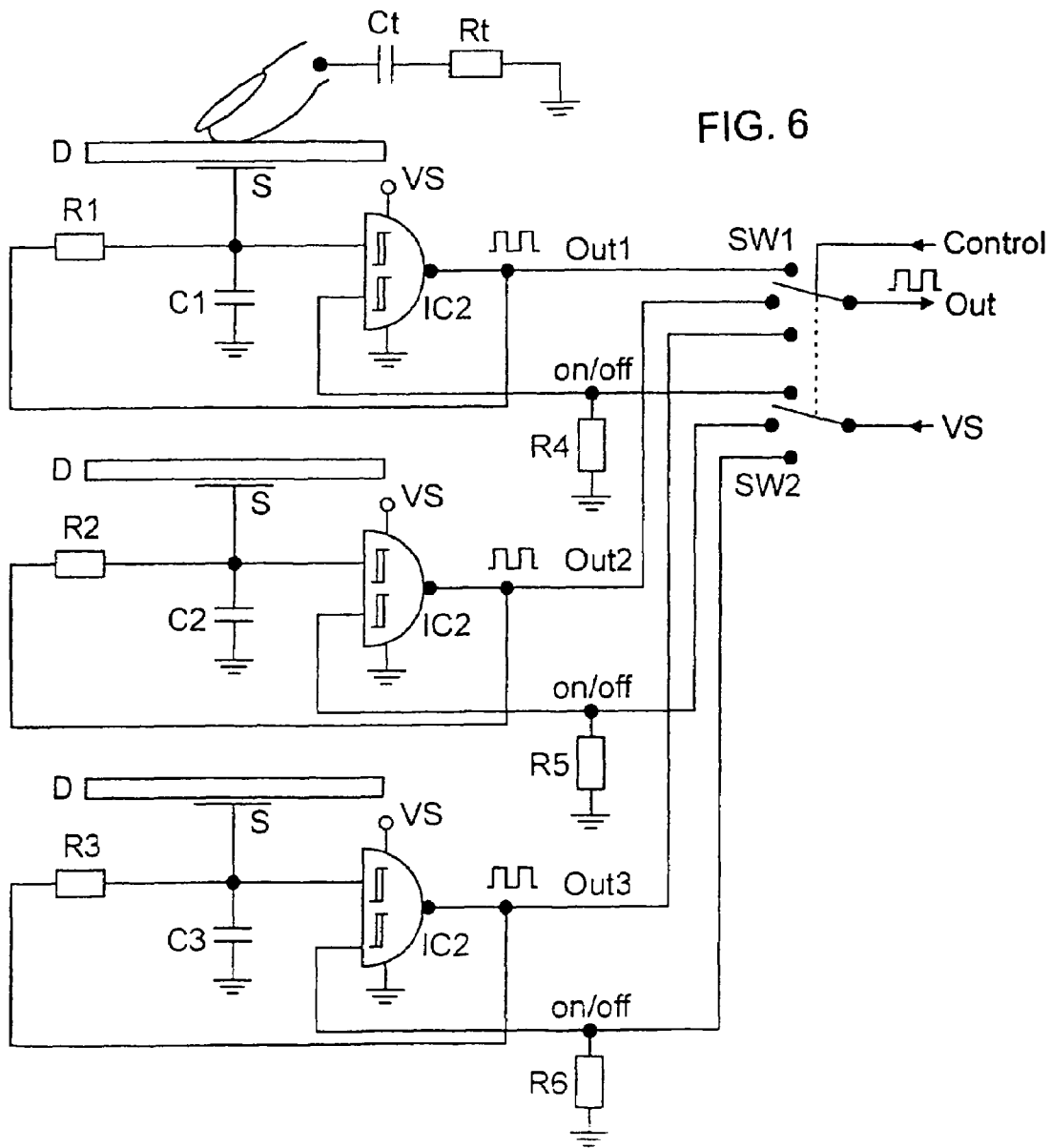
FIG. 6 is a block diagram of the circuit configuration for a plurality of capacitive touch switches in accordance with a fifth exemplary embodiment of the invention.

FIG. 6 illustrates the circuit configuration of such an exemplary embodiment having a plurality of sensor circuits whose capacitance/frequency converters Cf each contain the negating AND gate having input hysteresis IC2.

The configuration and method of operation of the individual sensor circuits of the circuit configuration of FIG. 6 correspond to those of the sensor circuit explained above with reference to FIG. 5; in particular, each of the sensor circuits contains the capacitive sensor element S, the capacitor C1 and a capacitance/frequency converter Cf having a negating AND gate IC2 with input hysteresis. The output signals Out1, Out2, Out3 from the (in this case three) sensor circuits are supplied to the (in this case three) inputs of a first changeover switch SW1. Under the control of the evaluation circuit, the first changeover switch SW1 switches its inputs in temporal succession to its one output, with the result that the individual output signals Out1, Out2, Out3 are supplied in temporal succession to the output circuit for further evaluation.

During time-division multiplexing, the associated square-wave oscillator can be respectively switched on for that period of time in which the frequency of the relevant sensor circuit is to be evaluated, while the square-wave oscillators of the other sensor circuits remain switched off in order to prevent any possible signal overcoupling. The square-wave oscillators can be switched on at the right time, for example, using a further changeover switch SW2, for example in the form of a demultiplexer, which is driven in synchronism with the first changeover switch SW1. This makes it possible to use the same control signals (Control) for the first and second changeover switches SW1 and SW2, which affords the advantage that there is no need for further control lines.

However, in contrast to the first changeover switch SW1 for the output signal Out, the signal direction is reversed in the case of the second changeover switch SW2 for switching on the square-wave oscillators, that is to say one input (VS) must be routed to a plurality of outputs. A fixed ON signal, for example in the form of an operating voltage Vs, may be supplied to the input of the second changeover switch SW2 as a logic one or high. Alternatively, a variable (controlled) ON signal may also be supplied to the input of the second changeover switch SW2, with the result that all of the square-wave oscillators of the sensor circuits may also be switched off if required.

The second changeover switch SW2 distributes the ON signal among the various square-wave oscillators of the sensor circuits. If the outputs are undefined (for example have a high impedance) when the ON signal is not switched through, the outputs of the second changeover switch SW2 are each connected to a pull-down resistor R4-R6 in order to supply an OFF signal, for example in the form of earth, to the square-wave oscillators (which are to be switched off) as a logic zero or low.

It goes without saying that the circuit configuration illustrated in FIG. 6 is not restricted either to the three sensor circuits having a total of three capacitive sensor elements S. Instead, the output signals Out from only two or from more than three sensor circuits may also be supplied to the common evaluation circuit via the first changeover switch SW1.

Even if it is not expressly described, it is, of course, also possible to use the circuit configuration having a sensor circuit of FIG. 5 as a basis for constructing a circuit configuration having a plurality of sensor circuits as in FIG. 4. That is to say, the parallel circuits containing the fixed capacitor C1 and the capacitance value Ct of the capacitive sensor element S of the plurality of sensor circuits are directly connected to the inputs of the first changeover switch SW1 whose output is connected to the evaluation circuit via a negating AND gate having input hysteresis IC2.

It goes without saying that the statements relating to the evaluation circuit which have been made in connection with FIG. 1 apply equally to all of the exemplary embodiments.

This application claims the priority, under 35 U.S.C. § 119, of German patent application No. 10 2004 060 847.4, filed Dec. 17, 2004 and German patent application No. 10 2005 014 933.2, filed Apr. 1, 2005; the entire disclosure of the prior application is herewith incorporated by reference.

We claim:

1. A circuit configuration for a capacitive touch switch, the circuit configuration comprising:
    at least one sensor circuit containing:
        a capacitive sensor element changing its capacitance value when touched;
        a capacitor connected in parallel with said capacitive sensor element and defining a parallel circuit;
        a capacitance/frequency converter connected to said parallel circuit containing said capacitor and said capacitive sensor element, said capacitance/frequency converter generating and outputting a frequency signal having a frequency being dependent on a total capacitance of said parallel circuit formed of said capacitor and said capacitive sensor element;
    said at least one sensor circuit being one of a plurality of sensor circuits outputting output signals and each of said sensor circuits having said capacitive sensor element;
    an evaluation circuit receiving the frequency signal being an output signal from said sensor circuit for determining whether said capacitive sensor element is actuated or not; and
    a switch connected between said plurality of sensor circuits and said evaluation circuit, the output signals from said plurality of sensor circuits being alternately supplied to said evaluation circuit through said switch.

2. The circuit configuration according to claim 1, wherein said capacitance/frequency converter has an input connected in parallel with said parallel circuit formed of said capacitor and said capacitive sensor element.

3. The circuit configuration according to claim 1, wherein said capacitance/frequency converter has a resistor and an inverter with input hysteresis connected to said resistor, said inverter has an input and an output coupled to and feeding back to said input through said resistor.

4. The circuit configuration according to claim 1, wherein said capacitance/frequency converter contains a negating AND gate having hysteresis and an input connected to said parallel circuit formed of said capacitor and said capacitive sensor element.

5. The circuit configuration according to claim 1, wherein said capacitance/frequency converter of each of said plurality of sensor circuits includes an inverter with input hysteresis and output an output signal from said inverter to said switch.

6. The circuit configuration according to claim 1, wherein said capacitance/frequency converter of each of said plurality of sensor circuits each have a negating AND gate having input hysteresis and outputting an output signal received by said switch.

7. The circuit configuration according to claim 1,
    wherein said parallel circuit formed of said capacitor and said capacitive sensor element of each of said plurality of sensor circuits are each directly connected to said switch;
    further comprising a common negating AND gate having input hysteresis; and
    wherein said switch has an output connected to said common negating AND gate.

8. The circuit configuration according to claim 1, wherein said evaluation circuit contains an event counter for counting pulses in the output signal from said sensor circuit.

9. The circuit configuration according to claim 1, wherein said evaluation circuit compares a frequency of the output signal from said sensor circuit with a basic frequency, the basic frequency being a frequency averaged over a long period of time of the output signal from said sensor circuit when said capacitive sensor element is not being touched.

10. The circuit configuration according to claim 1, wherein said plurality of sensor circuits are configured so that each of said sensor circuits can be independently switched off thereby allowing only one of the plurality of sensor circuits to be active.

11. A circuit configuration for a capacitive touch switch, the circuit configuration comprising:
    a plurality of sensor circuits each having a capacitive sensor element changing its capacitance value when touched, and a capacitor connected in parallel with said capacitive sensor element and defining a parallel circuit;
    a switch directly connected to each said parallel circuit from each of said plurality of sensor circuits and having a switch output;
    a capacitance/frequency converter connected to said switch output, said capacitance/frequency converter generating and outputting a frequency signal having a frequency being dependent on a total capacitance of a respective said parallel circuit formed of said capacitor and said capacitive sensor element of one of said plurality of said sensor circuits, said capacitance/frequency converter having a common inverter with input hysteresis;
    an evaluation circuit receiving the frequency signal being an output signal from a respective one of said plurality of sensor circuits for determining whether said capacitive sensor element is actuated or not; and
    said plurality of sensor circuits generating output signals alternately supplied to said evaluation circuit through said switch and said common inverter.

12. A circuit configuration for a capacitive touch switch, the circuit configuration comprising:
    a plurality of sensor circuits each having a capacitive sensor element changing its capacitance value when touched, and a capacitor connected in parallel with said capacitive sensor element and defining a parallel circuit;
    a switch directly connected to each said parallel circuit from each of said plurality of sensor circuits and having a switch output;

a capacitance/frequency converter connected to said switch output, said capacitance/frequency converter generating and outputting a frequency signal having a frequency being dependent on a total capacitance of a respective said parallel circuit formed of said capacitor and said capacitive sensor element of one of said plurality of said sensor circuits, said capacitance/frequency converter having a common negating AND gate with input hysteresis;

an evaluation circuit receiving the frequency signal being an output signal from a respective one of said plurality of sensor circuits for determining whether said capacitive sensor element is actuated or not; and said plurality of sensor circuits generating output signals alternately supplied to said evaluation circuit through said switch and said common negating AND gate.

* * * * *